(12) United States Patent
Kroneberger et al.

(10) Patent No.: US 7,764,008 B2
(45) Date of Patent: Jul. 27, 2010

(54) ELECTRON BEAM GUN

(75) Inventors: Cris Keith Kroneberger, Fairfield, CA (US); Ping Chang, Danville, CA (US)

(73) Assignee: Ferrotec (USA) Corporation, Bedford, NH (US)

( * ) Notice: Subject to any disclaimer, the term of this patent is extended or adjusted under 35 U.S.C. 154(b) by 581 days.

(21) Appl. No.: 11/709,534

(22) Filed: Feb. 22, 2007

(65) Prior Publication Data
US 2007/0210691 A1    Sep. 13, 2007

Related U.S. Application Data

(60) Provisional application No. 60/776,702, filed on Feb. 24, 2006.

(51) Int. Cl.
*H01J 29/46* (2006.01)
(52) U.S. Cl. .......................... 313/446; 373/13
(58) Field of Classification Search ................. 313/446; 373/13
See application file for complete search history.

(56) References Cited

U.S. PATENT DOCUMENTS

| 3,172,007 | A | 3/1965 | Hanks et al. |
| 3,801,719 | A | 4/1974 | Pudliner |
| 5,182,488 | A | 1/1993 | Hill et al. |
| 6,196,889 | B1 | 3/2001 | Mensinger |

FOREIGN PATENT DOCUMENTS

| EP | 0 569 076 A1 | 11/1993 |
| JP | 2004-192903 | 7/2004 |
| WO | WO 01/59808 A1 | 8/2001 |

OTHER PUBLICATIONS

Yuji Takizawa, English language abstract of JP Publication No. 2004-192903 A, "Electron Gun," Prazmatec KK, Jul. 8, 2004.
European Search Report of Application No. EP 07250767, mailed Dec. 27, 2007; Date of completion of the Search: Dec. 6, 2007.

*Primary Examiner*—Nimeshkumar D. Patel
*Assistant Examiner*—Mary Ellen Bowman
(74) *Attorney, Agent, or Firm*—Mesmer & Deleault, PLLC

(57) ABSTRACT

An electron beam gun with an arched shaped beam former as an integral part of a massive cathode block which conducts heat away from the beam former and with a filament mounted to the cathode block for improved alignment.

20 Claims, 8 Drawing Sheets

101
Ceramic support base insulator

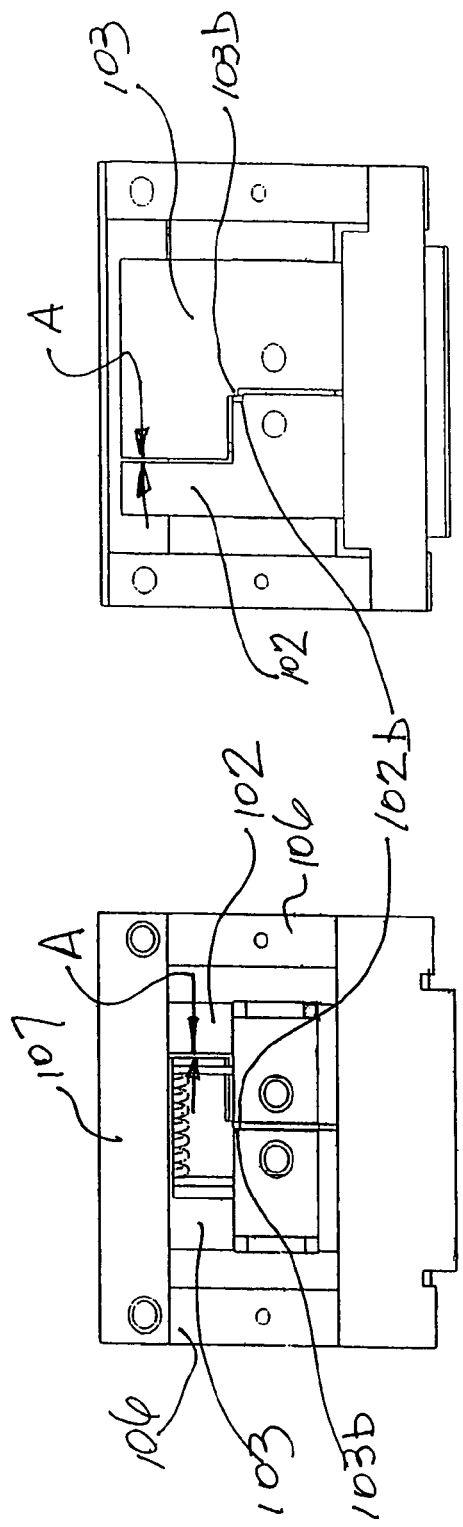
FIG 10
FIG 11
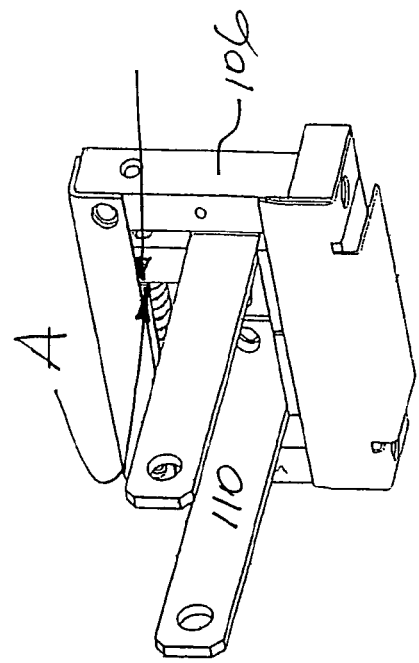
FIG 12

ELECTRON BEAM GUN

This application claims priority from U.S. Provisional Patent Application Ser. No. 60/776,702 filed Feb. 24, 2006.

BACKGROUND OF THE INVENTION

The present invention relates to electron beam guns for an electron beam evaporation source of the type used in depositing a thin film of evaporated material. More particularly, the present invention relates to several improvements in electron beam guns.

Electron beam guns for an electron beam evaporation source are well known in the art. Exemplative of electron beam guns are those disclosed in U.S. Pat. No. 5,182,488 which is assigned to The BOC Group, Inc. and is hereby incorporated by reference.

Referring to FIG. 1, an electron beam gun of the prior art is shown. Electron beam gun 10 is provided with a cathode block 12 having two conductive sides 14 and 16 spaced slightly apart from one another. A filament 18 is connected to sides 14 and 16 of filament block 12 by two filament clamps 20 and 22, affixed to the two sides 14 and 16 of cathode block 12. Two filament buss bars 28 and 30 are in turn connected to sides 14 and 16 of filament block 12 to apply an electric current across sides 14 and 16 of cathode block 12, and thus, filament 18. The electric current causes filament 18 to emit electrons.

Filament buss bars 28 and 30 are in turn connected to mounting bar 40. Cathode block 16 is insulated from mounting bar 40 by provision of 2 sets of insulative washer pairs 42 and 44. One of the filament blocks must be insulated from mounting bar 40 to prevent sides 14 and 16 of cathode block 12 from being shunted. Mounting bar 40 is in turn connected at its ends to a support bar 46 by screws which pass through insulator pairs 52 and 54. Insulator 54 slides into shield 52 in a manner well known in the art.

An anode 56 is provided to accelerate electrons emitted by filament 18. Anode 56 is connected at the bottom to anode mounting bracket 58. Anode mounting bracket 58, at its ends, is in turn attached to support bar 46. Anode 56 has a top portion 64 of inverted U-shaped configuration which terminates in a front edge 66 in front of filament 18.

A beam former 68 is provided. Beam former 68 is configured to shield filament 18 from anode 56. Beam former 68 is located between filament 18 and anode 56, and has essentially the same shape as anode 56. That is, it has a top portion 70 of inverted U-shaped configuration terminating in a lower edge 72 located between lower edge 66 of anode 56 and filament 18.

The shielding provided by beam former 68 causes electrons emitted by filament 18 to form an electron cloud under top portion 70 of beam former 68. As a result, a virtual cathode is formed from which electrons pass beneath lower edge 72 of beam former 68 in a flat ribbon-like configuration toward lower edge 66 of anode 56. By the time electrons reach lower edge 66 of anode 56, a sufficient kinetic energy has been imparted such that the ribbon-like beam misses anode 56 and is emitted from electron beam gun 10.

In earlier prior art, beam former was formed in a single section and was connected to one side of cathode block. The other side of beam former was insulated from the other side of cathode block to prevent cathode block from being shunted. The end result of this was that a thermal gradient was produced within beam former in which beam former was coolest at its attachment side of cathode block 12.

In such earlier prior art devices, the thermal gradient within the beam former caused warpage and translational and rotational movement which in turn caused electrons emitted by the filament to directly arc and strike the anode as well as cause deformation of the ribbon-shaped beam to produce non-uniform evaporation as the electron beam gun aged over its service life.

In order to overcome the disadvantages of warping and translational and rotational movement resulting from the thermal gradient within the beam former, the prior art beam former 68 is formed of two sections 74 and 76 separated by a gap 78. Sections 74 and 76 of beam former 68 are separately connected to sides 14 and 16 of cathode block 12.

The beam former deflects the electrons produced by the filament so that they pass by the edge of the anode instead of actually hitting the anode. Misalignment of the beam former or the anode can result in damage in the form of erosion or melting of the anode.

One group of prior art electron beam guns uses a beam former that is attached to and cantilevered off of one of the support members or cathode blocks. In this configuration, the beam former is spaced off of and insulated from the adjacent cathode block, usually by a ceramic spacer. One of the problems with these prior art arrangements is that the beam former can become misaligned by loosening, bending or warping during use and thermal cycling. Since the beam former is only secured at one side and extends across the hot filament in this cantilever arrangement, misalignment of the beam former is likely.

In another group of prior art electron beam guns and in particular, the electron beam gun discussed above, the beam former is separated into two sections with each section attached to its own support member. Such configuration of the beam formers is somewhat more stable since they are shorter and not cantilevered; however the potential for misalignment is significant. If the gap between the two halves of the beam former becomes too large, a significant amount of electrons can pass through this gap resulting in erosion and melting of the beam former edges as well as melting of the anode. Moreover, a short circuit could occur if the two halves of the beam former come into contact with each other due to shifting of the cathode blocks or beam former during use and thermal cycling. In both of these prior art designs, it takes significant effort to place the critical edge of the beam former in the correct location since it is a separate part or parts from the cathode blocks.

In addition, since the anode is a thin structure with supports located away from and on a separate face other than the critical alignment face directly in front of the beam former, anode warping can progress to the point of disalignment which degrades the performance of the electron gun.

BRIEF DESCRIPTION OF THE DRAWINGS

FIGS. 10, 11 and 12 are front, rear and perspective views of the electron beam gun of the present invention showing the gap between cathode blocks.

DETAILED DESCRIPTION OF THE INVENTION

Figure 1:
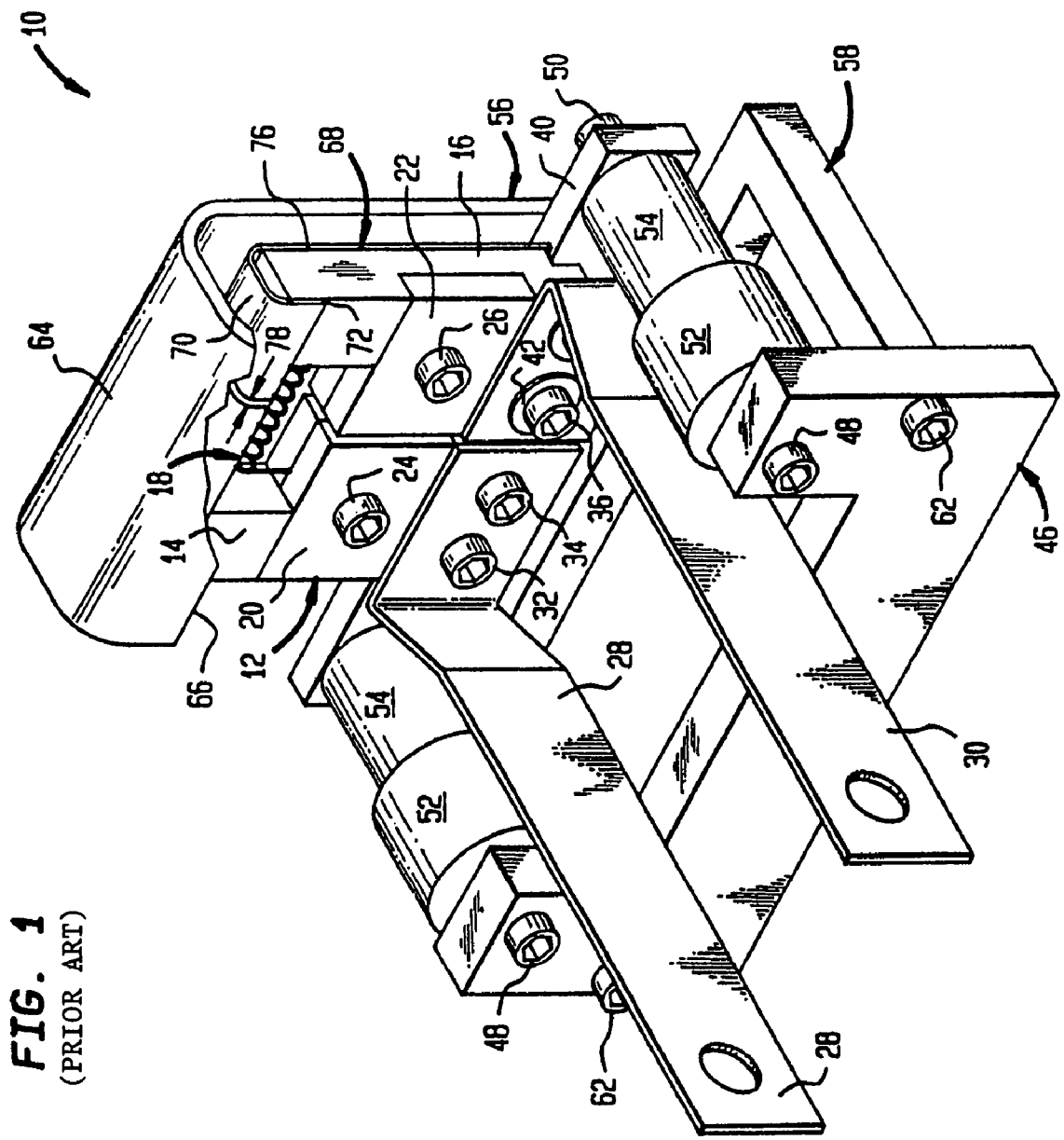
FIG. 1 is a perspective view of an electron beam gun of the prior art with portions of the anode broken away.

Each of the component parts of the present inventive electron beam gun and their function are generally set forth as in the prior art with the exceptions discussed below and depicted in FIGS. 2-12.

In accordance with one aspect of the present invention electron beam gun 100 is provided with a cathode comprising two conductive sides, cathode block 102 and cathode block with beam former 103. A filament 109 is connected to block 102 and block 103 and secured within channels 102a and 103a directly by buss bar and filament clamps 110. Integral to cathode block 103 is beam former 104. In accordance with one aspect of the present invention, by incorporating beam former 104 integrally with cathode block 103, and which is substantially more massive than cathode block 102, heat is more readily conducted away from beam former 104 into the larger mass of cathode block 103. Accordingly, beam former 104 is less prone to become warped or to melt. In addition, by incorporating beam former 104 with cathode block 103, beam former is less prone to become misaligned from the cathode block as in the prior art which required a fastener or a spacer to keep it aligned with the cathode block. In addition, by mounting filament 109 to cathode block 103 which incorporates beam former 104, improved alignment between the beam former and the filament is maintained over the operating life of the electron beam gun.

Figure 2:
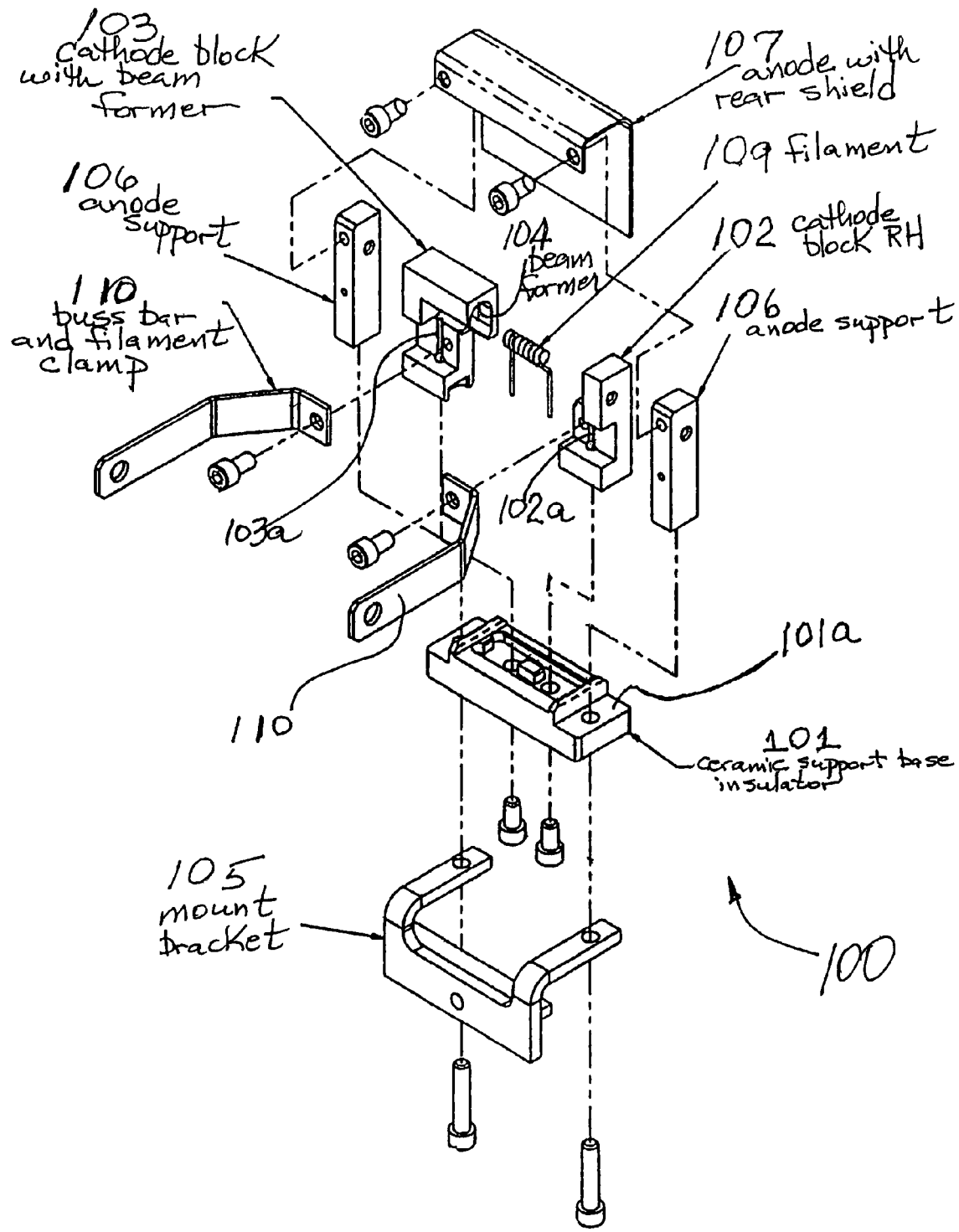
FIG. 2 is an exploded view of the electron beam gun of the present invention.
Figure 3:
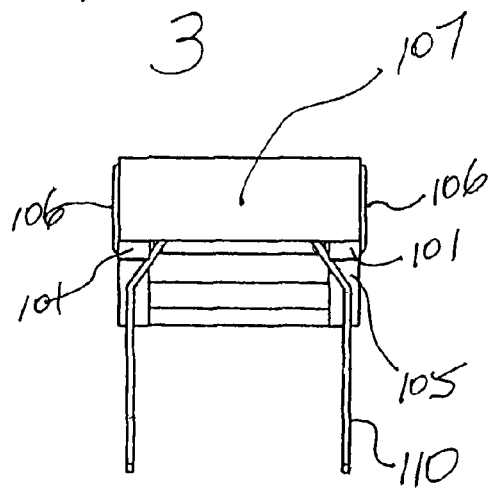
FIG. 3 is a top view of the electron beam gun shown in FIG. 2.
Figure 4:
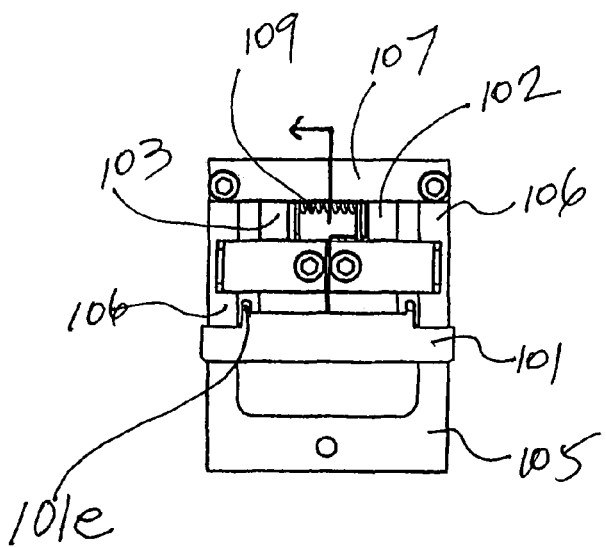
FIG. 4 is a front view of the electron beam gun shown in FIG. 2.
Figure 5:
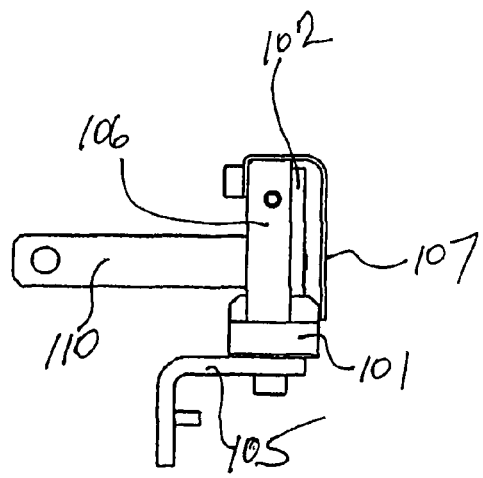
FIG. 5 is a side view of the electron beam gun shown in FIG. 2.
Figure 6:
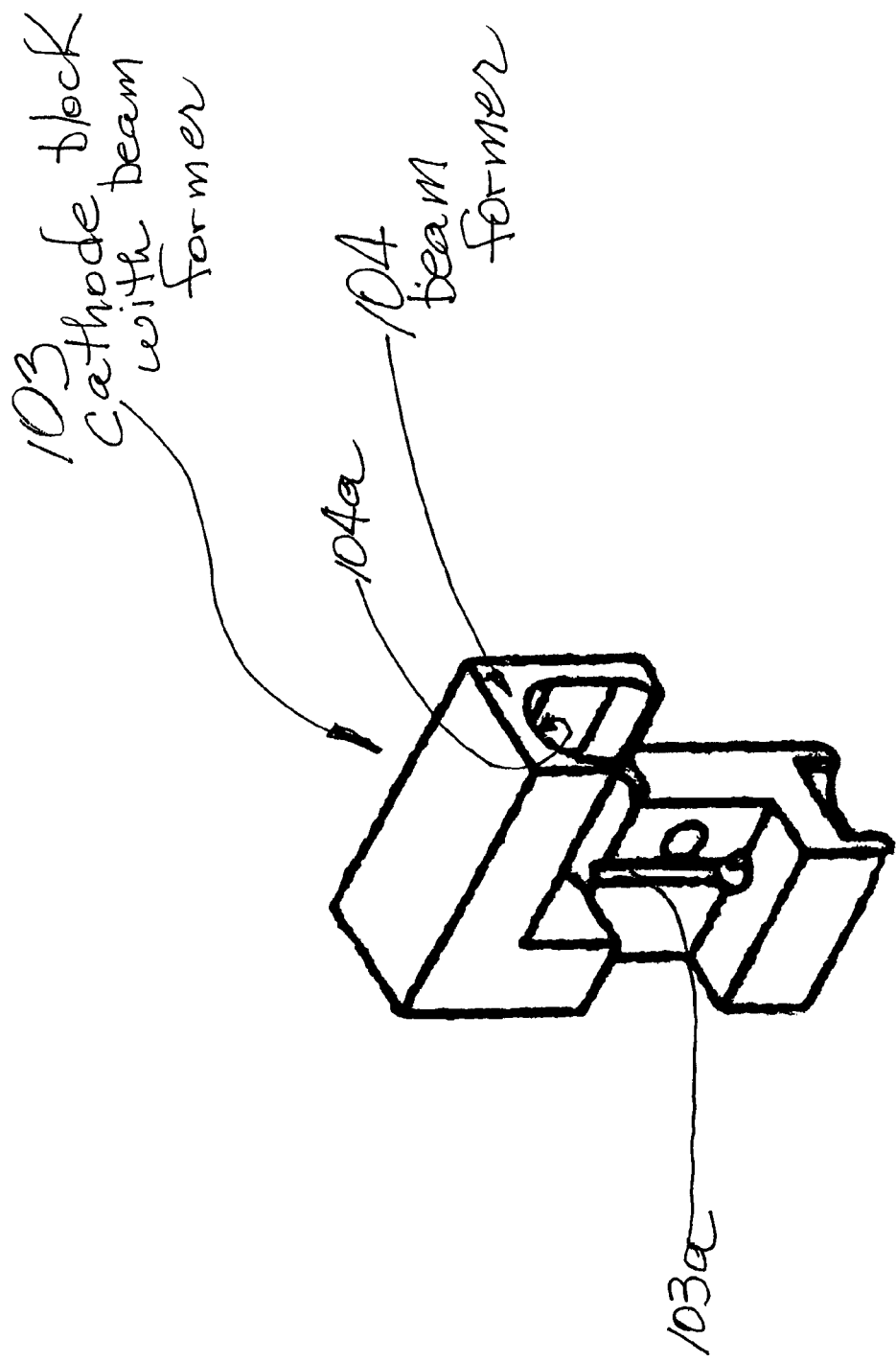
FIG. 6 is an enlarged perspective view of the cathode block with beam former shown in FIG. 2.

The incorporation of beam former 104 in cathode block 103 as shown in FIG. 2 as contrasted to having equal portions of the beam former in each of cathode block 103 and cathode block 102 prevents a direct line of sight path for the electrons between filament 109 and anode 107. This offset split depicted as "A" in FIGS. 10, 11 and 12 between the cathode block 103 beam former 104 and cathode block 102 is just one embodiment in which the beam former is placed towards or beyond one end of the filament so as to prevent a direct line of sight path between the filament and anode 107. This reduces the probability of significant electron flow through the gap between the cathode blocks thereby precluding resulting damage to the beam former due to erosion or melting.

Anode 107 which is secured to anode supports 106 which in turn are mounted to support base 101 as shown in FIGS. 2-5 is located directly in front of beam former 104. The offset split A in beam former 104 between cathode blocks 103 and 102 also reduces the probability of significant electron flow through the gap between the cathode blocks thereby reducing resulting damage to anode 107.

In accordance with another aspect of the invention, cathode block 102 and cathode block 103 are provided with a recess 102b and a mating tab 103b on abutting surfaces (as best seen in FIG. 11) so as to eliminate a direct line of sight between filament 109 and base 101. Since the abutting surfaces of cathode block 102 and cathode block 103 are positioned below filament 109, the probability of electrons passing through the space between abutting surfaces of cathode block 102 and cathode block 103 to base 101 is thereby reduced.

In another aspect of the present invention, an interior surface of beam former 104 which faces filament 109 is arch shaped 104a and integral to cathode block 103 so as to prevent a direct line of sight between filament 109 and any other structure above, behind or below filament 109.

The cathode block assembly comprising cathode blocks 102 and 103 with: (a) an offset split in beam former 104; (b) a recess and mating tab on abutting surfaces of the cathode blocks; and (c) an arch shaped interior surface to the beam former; comprise a structure that is well sealed from electron leakage so that electrons are appropriately directed towards and past the anode as desired, and at the same time reduces the potential for damage to components of the electron beam gun and surrounding structure resulting from electrons undesirably passing through gaps in the structure.

Figure 7:
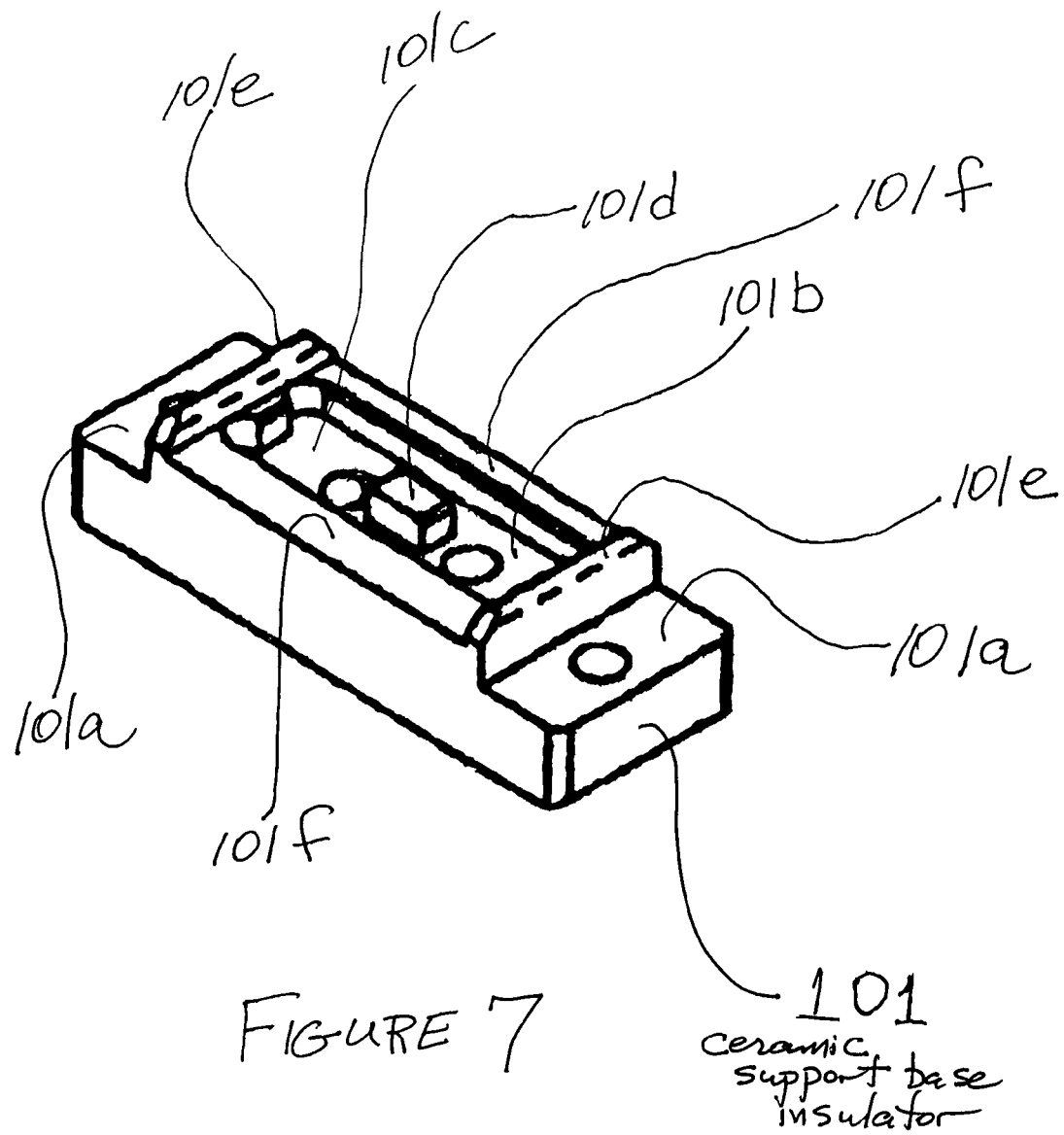
FIG. 7 is an enlarged perspective view of the support base insulator shown in FIG. 2.

Referring to FIG. 2, anode with rear shield 107 is secured at each of its ends to anode supports 106, the bases of which are mounted in support base 101. In addition to anode supports 106, cathode blocks 102 and 103 are mounted to insulating support base 101. In accordance with another aspect of the present invention, a single insulating support base is provided and having predetermined positions and precise alignments between critical features of the electron beam gun as shown in FIGS. 2 and 7. In addition to predetermined contour 101a for each of anode supports 106, pockets 101b and 101c are formed into the face of base 101 to precisely locate and align the mating bottom contours of cathode blocks 102 and 103.

Pockets 101b and 101c and bump 101d provide precise positioning and alignment of cathode blocks 102 and 103 in two planes of movement, and a screw or other mechanical attachment to the cathode blocks provides the alignment in the third plane. By so securing and aligning the cathode blocks in and to the support base, the cathode blocks are maintained in their proper position and relative orientation during and after thermal cycling. In addition, by so securing the cathode blocks 102 and 103 to support base 101, precise positioning to achieve the predetermined offset split A is achieved without the requirement for it to be measured and set by an assembler of the electron beam gun. In addition, base 101 has divider walls 101e, 101f to further define the precise location and orientation of cathode blocks 102, 103 as well as anode supports 106.

Each of these features present a discontinuity in the surfaces between cathode blocks 102, 103, having high negative voltage potential, and the anode supports 106, typically at ground potential, which individually and in the aggregate greatly reduce if not eliminate the possibility for arcing between these structures by creating a tortuous path which inhibits the propagation of an arc along such a path.

Figure 8:
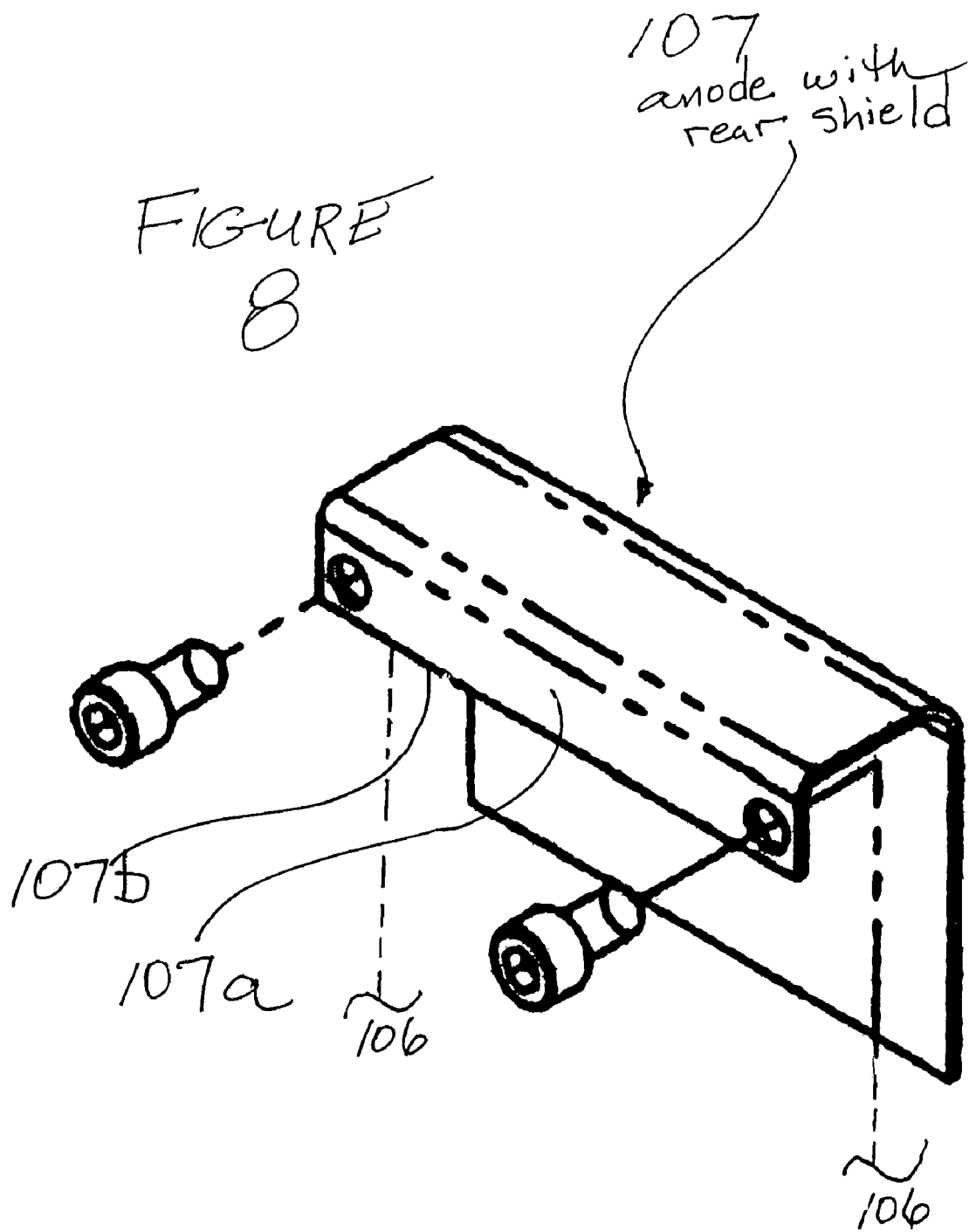
FIG. 8 is an enlarged perspective view of the anode with rear shield shown in FIG. 2.

In accordance with yet another aspect of the present invention, anode with rear shield 107 is secured along the surface which is most susceptible to warping during operation and thermal cycling. Accordingly, anode 107 is secured at each end along surface 107a to anode supports 106 to preclude edge 107b from movement as shown in FIG. 8.

In accordance with yet a further advantage over the prior art, each leg of filament 109 is secured directly within channel 102a and within channel 103a between buss bar 110 and cathode blocks 102 and 103 as shown in FIG. 2.

In prior art designs the filament was typically secured between filament clamps and cathode blocks, while the buss bars were connected to the cathode blocks at a different location. By directly securing the buss bars with the filament ends to the cathode blocks, the number of electrical connection points in hot regions are reduced by 50%.

Figure 9:
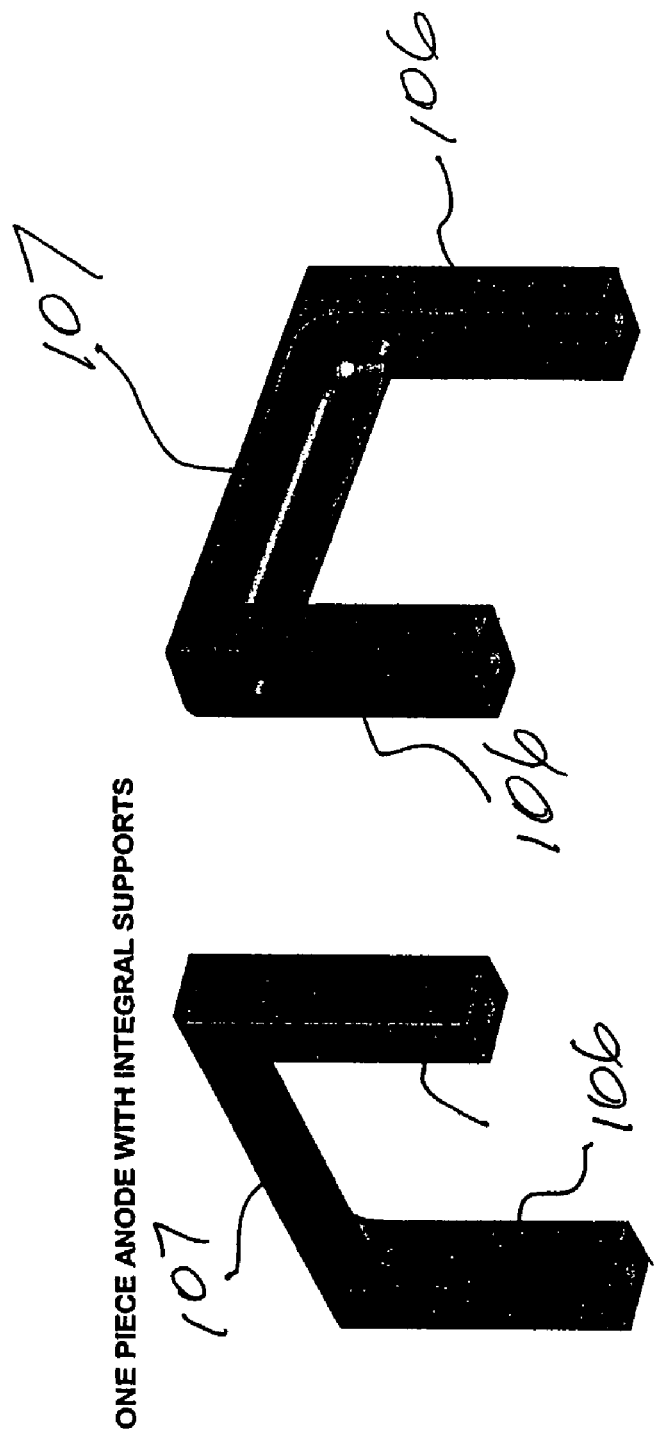
FIG. 9 is a perspective view of a one piece anode with integral supports.

In accordance with another aspect of the present invention, anode 107 and anode supports 106 are formed as an integral part instead of multiple parts in order to enhance the rigidity, alignment and cooling of the anode structure (FIG. 9). The integral anode structure can comprise the anode and anode supports, or it can also be comprised to further include a rear facing shield as well.

While the foregoing description and drawings represent the preferred embodiments of the present invention, it will be apparent to those skilled in the art that various changes and modifications may be made therein without departing from the true spirit and scope of the present invention.

The invention claimed is:

1. An electron beam gun for the production of electrons comprising:
an electrical cathode comprising at least two cathode blocks wherein a first one of the two cathode blocks is substantially more massive than a second of the two cathode blocks and wherein within the first cathode block is integrally formed a beam former without any mounting means disposed therebetween so that heat is conducted away from beam former to the first cathode block.

2. The electron beam gun as in claim 1 wherein the beam former is adapted to have an internally arched shape.

3. The electron beam gun as in claim 2 further comprising a filament for the production of electrons and mounted to the first cathode block.

4. The electron beam gun as in claim 3 further comprising an anode and wherein the second cathode block is positioned so as to prevent a direct line of sight path for the electrons between the filament and the anode.

5. The electron beam gun as in claim 4 wherein the filament has an end and the beam former is positioned proximate the end of the filament so as to prevent a direct line of sight for the electrons between the filament and the anode.

6. The electron beam gun as in claim 3 further comprising an anode, anode supports, and a support base, and wherein the anode is connected to the anode support, the anode supports are connected to the support base, and the anode is proximate a front portion of the beam former.

7. The electron beam gun as in claim 3 further comprising a support base for supporting an anode and the at least two cathode blocks, and wherein one of the at least two cathode blocks is provided with a recess and another of the at least two cathode blocks is adapted to have a tab having a configuration which mates to the recess so as to prevent a direct line of sight for the electrons between the filament and the support base.

8. The electron beam gun as in claim 3 further comprising an anode, an anode support, and a support base, wherein the support base comprises a single insulating member having first positions for receiving the anode support and further having second positions for receiving each cathode block.

9. The electron beam gun as in claim 8 wherein the support base has a first pair of divider walls, each one of the first pair is positioned between a corresponding one of the first positions and a corresponding one of the second positions.

10. The electron beam gun as in claim 9 wherein the support base further comprises a second pair of divider walls each divider wall extending between the first pair of divider walls from the surface of the base at an outer edge of the base.

11. The electron beam gun as in claim 10 further comprising a bump extending from the surface of the base and between the second positions, means for attaching a bottom portion of each of the cathode blocks to a corresponding one of the second positions so that the cathode blocks are restrained from movement in each of three planes of movement.

12. The electron beam gun as in claim 8 wherein the anode further comprises a rear shield portion, a top, and a surface face, and wherein the top is connected to the rear portion and the surface face substantially orthogonally, and wherein the surface face has an edge, and each one of the two cathode blocks is secured to the anode along the surface face disposed proximate the edge and proximate opposite ends of the anode.

13. The electron beam gun as in claim 9 wherein the anode further comprises a rear shield portion, a top, and a surface face, and wherein the top is connected to the rear portion and the surface face substantially orthogonally, and wherein the surface face has an edge, and each one of the two cathode blocks is secured to the anode along the surface face disposed proximate the edge and proximate opposite ends of the anode.

14. The electron beam gun as in claim 10 wherein the anode further comprises a rear shield portion, a top, and a surface face, and wherein the top is connected to the rear portion and the surface face substantially orthogonally, and wherein the surface face has an edge, and each one of the two cathode blocks is secured to the anode along the surface face disposed proximate the edge and proximate opposite ends of the anode.

15. The electron beam gun as in claim 11 wherein the anode further comprises a rear shield portion, a top, and a surface face, and wherein the top is connected to the rear portion and the surface face substantially orthogonally, and wherein the surface face has an edge, and each one of the two cathode blocks is secured to the anode along the surface face disposed proximate the edge and proximate opposite ends of the anode.

16. The electron beam gun as in claim 8 wherein the anode comprises a rear shield portion, a top, a surface face, and wherein the top is connected to the rear portion and the surface face substantially orthogonally, and wherein the anode support further comprises two anode supports integrally formed with the anode.

17. The electron beam gun as in claim 9 wherein the anode comprises a rear shield portion, a top, a surface face, and wherein the top is connected to the rear portion and the surface face substantially orthogonally, and wherein the anode support further comprises two anode supports integrally formed with the anode.

18. The electron beam gun as in claim 10 wherein the anode comprises a rear shield portion, a top, a surface face, and wherein the top is connected to the rear portion and the surface face substantially orthogonally, and wherein the anode support further comprises two anode supports integrally formed with the anode.

19. The electron beam gun as in claim 11 wherein the anode comprises a rear shield portion, a top, a surface face, and wherein the top is connected to the rear portion and the surface face substantially orthogonally, and wherein the anode support further comprises two anode supports integrally formed with the anode.

20. The electron beam gun as in claim 3 wherein the filament comprises two legs, each of the cathode blocks comprise a channel for receipt of a leg of the filament, and further comprising buss bar and filament clamps which secure a corresponding filament leg to a corresponding cathode block.

* * * * *